United States Patent [19]

McCaldin et al.

[11] 4,123,295

[45] Oct. 31, 1978

[54] MERCURY CHALCOGENIDE CONTACT FOR SEMICONDUCTOR DEVICES

[75] Inventors: James O. McCaldin; John S. Best, both of Pasadena, Calif.

[73] Assignee: California Institute of Technology, Pasadena, Calif.

[21] Appl. No.: 759,350

[22] Filed: Jan. 14, 1977

[51] Int. Cl.² .......................................... H01L 21/363
[52] U.S. Cl. .................................... 148/33; 75/134 H; 252/62.3 ZT; 357/15; 357/65; 75/169
[58] Field of Search ................ 148/33, 1.5; 75/134 H, 75/169; 357/15, 65; 252/62.3 ZT

[56] References Cited

U.S. PATENT DOCUMENTS

| | | | |
|---|---|---|---|
| 3,037,065 | 5/1962 | Hockings et al. | 75/169 X |
| 3,496,024 | 2/1970 | Ruehrwein | 148/175 X |
| 3,614,551 | 10/1971 | Jenkins et al. | 148/33 X |
| 3,984,261 | 10/1976 | Hawrylo | 148/33 |

Primary Examiner—G. Ozaki
Attorney, Agent, or Firm—Linderberg, Freilich, Hornbaker, Wasserman, Rosen & Fernandez

[57] ABSTRACT

An improved contact material for use in the fabrication of semiconductor devices is provided. This material comprises one of the mercury chalcogenides. The application of this material to a nondegenerate semiconductor may be made by the process of evaporation. The resulting contact is stable in the atmosphere, and is more electronegative than the best contact material, namely gold, that is now used.

3 Claims, 3 Drawing Figures

MERCURY CHALCOGENIDE CONTACT FOR SEMICONDUCTOR DEVICES

This invention relates to semiconductor devices and more particularly to an improved contact material therefor.

In the present electronic device art, metal/semiconductor interfaces are widely employed. By choosing a particular metal for such an interface, the electron behavior of the device can often be improved or even optimized. In this connection, one often selects the metal gold, which is the most electronegative of the metallic elements. There are some alternate choices such as $(SN)_x$, to obtain *highly-electro-negative* contacts. These materials are not conventional metals, are good electrical conductors and may offer superior performance. However, these materials are awkward to fabricate into electronic devices.

OBJECTS AND SUMMARY OF THE INVENTION

An object of this invention is to provide a contact material for nondegenerate semiconductors, which has high electronegativity.

Another object of this invention is to provide a contact material for nondegenerate semiconductors which has a high electronegativity, and yet is still easy to fabricate onto the semiconductor.

Still another object of this invention is the provision of a novel and useful semiconductor contact material.

The foregoing and other objects of this invention may be achieved by using one of a group of materials which are designated as mercury chalcogenides, excepting those very sulphur-rich compositions with the cinnabar structure. These materials may comprise one of the binary compounds HgSe, HgTe, and $\beta$-HgS or alloys of these binary compounds. The preferred material is HgSe.

A contact in accordance with this invention, may be grown on the surface of the semiconductor material, by placing the semiconductor material inside a chamber and exposing it to mercury vapor within that chamber while evaporating the selenium or other material to be used.

The novel features of the invention are set forth with particularity in the appended claims. The invention will best be understood from the following description when read in conjunction with the accompanying drawings.

DESCRIPTION OF THE PREFERRED EMBODIMENTS

The mercury chalcogenides are always tetrahedrally coordinated structures, except that very sulfur-rich compositions at times adopt an alternative structure. The tetrahedral mercury chalcogenides are semimetals. As semimetals they do not permit their Fermi levels, $E_f$, to be moved much at their surfaces, just as is the case with metals. Thus, the contacts made of these materials on semiconductor bodies are similar to the conventional Schottky diode structure, thus nearly all of the band-bending occurs in the semiconductor.

In order to prepare samples to evaluate the Schottky barrier energies of HgSe on semiconductor substrates, single crystals of aluminum doped zinc sulphide and zinc selenide were prepared. The zinc sulphide and zinc selenide crystals were heat treated in liquid zinc to yield n-type carrier concentrations of about $5 \times 10^{16} cm^{-3}$ for the zinc sulfide and $5 \times 10^{17} cm^{-3}$ for the zinc selenide, as measured by the capacitance-voltage method. Ohmic contacts were made to the substrates by wetting the surface with an amalgam of Hg-In-Cd and heating to 450° C. for 1 minute.

Figure 1:
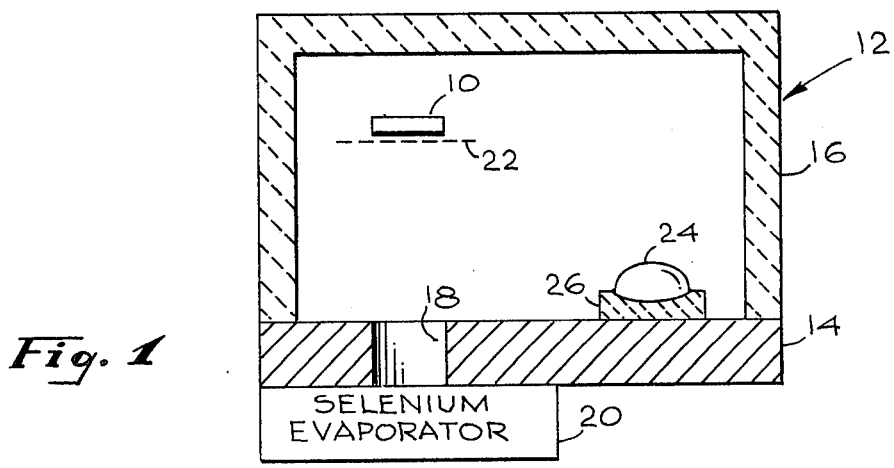
FIG. 1 is a view in cross section of the structure which may be used for depositing a mercury chalcogenide contact on a body of a semiconductor material.

The samples were then cleaved in air, and HgSe dots were grown on the freshly cleaved surface in the apparatus shown in FIG. 1. This comprises a cross section of an arrangement for depositing mercury chalcogenide contacts on a semiconductor.

The sample 10 is placed within a chamber 12, having a bottom wall 14 made of stainless steel, with the remaining walls of the chamber being made of quartz 16. A hole 18 is left in the stainless steel wall of the chamber to enable selenium vapor from a selenium evaporator 20, to enter the chamber. A mask 22 is interposed between the sample and the hole. At one side of the hole, a drop of triple distilled mercury 24 is placed on a quartz receptacle 26, and provides mercury vapor for the growth. The entire apparatus shown in FIG. 1 is placed in a high vacuum.

The mercury pressure inside the chamber is determined by the mercury temperature (25° C.), the area of the hole in the base of the chamber, the area of mercury surface, and the cleanliness of the mercury surface. This establishes a mercury pressure of somewhat less than the room temperature vapor pressure of $1.4 \times 10^{-3}$ Torr, so that mercury will not condense on either the specimen or the chamber walls. The sample 10 was placed directly over the hole on a fine screen evaporation mask to define small (approximately $3 \times 10^{-4}$ cm² area) dots. Reaction between the evaporating selenium and Hg vapor present in the chamber takes place at room temperature to form approximately stoichiometric HgSe as the selenium evaporates.

A typical week old sample of HgSe on ZnS was examined by Auger electron spectroscopy to obtain a qualitative measure of the composition of the HgSe layer. No oxygen or carbon was detected in the HgSe layer and it was determined, to within the 10% accuracy of the method used, that the layer is stoichiometric. The growth technique thus produced relatively pure HgSe that is stable in air. Some oxygen was found at the HgSe-ZnS interface.

Measurements of the resultant Schottky barriers were made using capacitance/voltage (C-V) and photoresponse techniques. These are described in an article by C. A. Mead, in a periodical entitled "Solid State Electronics," Volume 9, Page 1023, (1966). All measurements showed a barrier significantly larger than the Au barrier on the same substrate.

Figure 2:
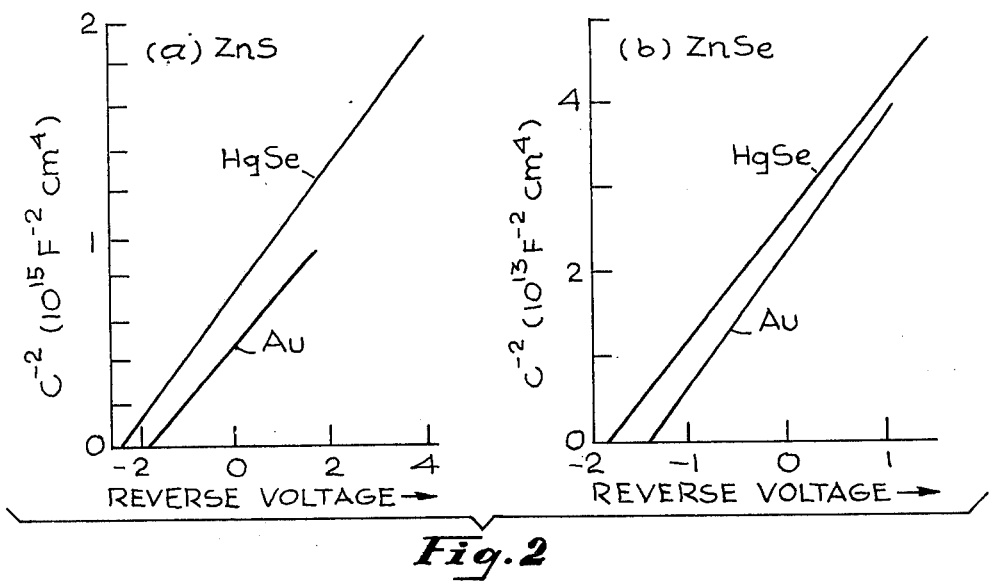
FIG. 2 comprises curves illustrating Schottky barrier capacitance-voltage measurements made using HgSe deposited on two different semiconductors which is shown to illustrate the superiority of this invention over gold.

FIG. 2 illustrates curves drawn from C-V data obtained on a sample of HgSe on ZnS and a sample of HgSe on ZnSe. The Schottky barrier can be determined from these curves by adding a correction for the diffusion potential to the voltage intercept of the data for the junction, in accordance with the teachings in an article by A. M. Goodman, in the "Journal of Applied Physics," Volume 34, Page 329, (1963). The range of values determined from the data taken on several samples is, for ZnS from 2.3 to 2.7eV and for ZnSe from 1.9 to 2.0eV. These may be compared with the established gold Schottky barrier heights of 1.9–2.0eV on zinc sulfide and 1.35eV on zinc selenide.

Figure 3:
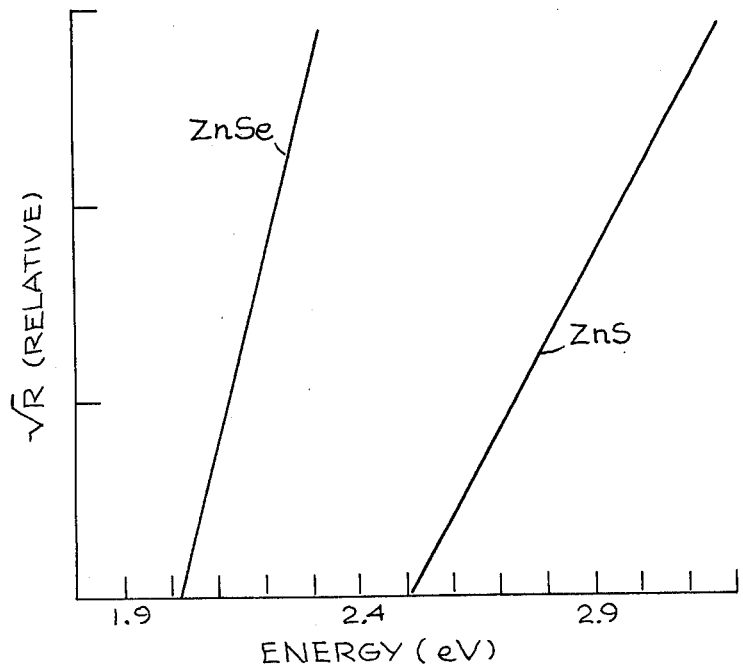
FIG. 3 provides photoresponse curves illustrating the high Schottky barrier energies obtainable using contacts on semiconductors made in accordance with this invention.

FIG. 3 represents photoresponse curves for HgSe on ZnS and ZnSe. The photoresponse Schottky barrier heights for HgSe on ZnS range from 2.5 to 2.7eV and for HgSe on ZnSe range from 2.0 to 2.1eV.

C-V and photoresponse data for HgSe on both the n-ZnS and n-ZnSe, as indicated by the curves, show that the Schottky barrier energies for these interfaces are about 0.5eV larger than Au-semiconductor barriers on the same substrate. Accordingly, an effective electronegativity for HgSe of about 2.9 on the Pauling scale may be assigned.

C-V measurements were made on one sample both immediately after fabrication and after exposure to air for 1 month. The barrier changed less than 50meV over that period. This measurement and other data demonstrate the stability of the HgSe contact under ambient conditions.

In summary, therefore, C-V and photoresponse measurements show that the mercury chalcogenide HgSe has an effective electronegativity greater than Au by 0.5 on the Pauling scale (See "The Nature of the Chemical Bond" by L. Pauling, Cornell University Press, Ithaca, N.Y. 1960, Third Edition, Page 93.) The semi-metallic contact material made in accordance with this invention was found to be stable under ordinary ambient conditions, to be easily fabricated and is structurally compatible with other tetrahedral semiconductors. It is useful for ohmic contact to p-semiconductors. Some p-type semiconductors, particularly phosphides and tellurides, are hard to make ohmic contact with (or elaborate procedures are required to do so). A p-type absorber such as indium phosphide or cadmium telluride used as a solar cell, can use back contacts of mercury chalcogenide which are evaporated thereon in the manner described herein and thus ohmic contact can be made therewith in a much simpler manner than possible until this invention was made.

Another use for contacts, in accordance with this invention, may be to provide large electric fields in semi-insulating semiconductors. For example, if a semi-insulator is sandwiched between electronegative contact, and a contact of low-work function ("electropositive contact"), e.g., $In_2O_3$ which is always n-type, then an electric field can penetrate through the entire layer of semi-insulator. For this purpose, thin layers and "ionic" semi insulators like zinc sulfide are helpful. In any case, the more electronegative the first contact, the stronger the field. From the foregoing, it can be seen than $E_f$ is lower in Hg chalcogenide than in gold.

Finally, as has been shown in detail, the contact in accordance with this invention produces higher Schottky barriers on n-semiconductors than are presently achievable with gold.

We claim:

1. In combination with a semiconductor, an improved contact made by stoichiometric deposition of one of the mercury chalcogenides selected from the group consisting of the binary compounds HgSe, HgTe, and $\beta$-HgS, or solid solutions of these binary compounds on a semiconductor body to form an abrupt interface and energy gap change between the contact and the semiconductor body.

2. An improved ohmic contact material for a p-type semiconductor body comprised of one of the mercury chalcogenide materials selected from the group consisting of HgSe, HgTe, and $\beta$-HgS, or solid solutions of these compounds, stoichiometrically deposited on the surface of said p-type semiconductor to form an abrupt interface and energy gap change between the contact material and the semiconductor body.

3. A contact material for producing high Schottky barrier energies on an n-type semiconductor body comprised of one of the mercury chalcogenide materials selected from the group consisting of HgSe, HgTe, and $\beta$-HgS, or solid solutions of these compounds stoichiometrically deposited to form an abrupt interface and energy gap change between the contact material and the semiconductor body.

* * * * *